(12) United States Patent
Murdock

(10) Patent No.: US 12,266,582 B2
(45) Date of Patent: Apr. 1, 2025

(54) HERMETIC PACKAGE FOR HIGH CTE MISMATCH

(71) Applicant: Qorvo US, Inc., Greensboro, NC (US)

(72) Inventor: Dylan Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 279 days.

(21) Appl. No.: 17/394,083

(22) Filed: Aug. 4, 2021

(65) Prior Publication Data

US 2022/0044979 A1    Feb. 10, 2022

Related U.S. Application Data

(60) Provisional application No. 63/060,766, filed on Aug. 4, 2020.

(51) Int. Cl.
*H01L 23/31* (2006.01)
*H01L 23/04* (2006.01)
(Continued)

(52) U.S. Cl.
CPC .......... *H01L 23/3142* (2013.01); *H01L 23/04* (2013.01); *H01L 23/10* (2013.01); *H01L 23/291* (2013.01); *H01L 23/315* (2013.01); *H01L 23/481* (2013.01); *H01L 23/3736* (2013.01); *H01L 24/48* (2013.01); *H01L 24/49* (2013.01);
(Continued)

(58) Field of Classification Search
CPC ............... H01L 23/373; H01L 23/3675; H01L 23/291; H01L 23/49811; H01L 23/3735; H01L 23/66; H01L 23/49568; H01L 24/49; H01L 23/13; H01L 23/10; H01L 23/3142; H01L 23/04; H01L 23/315; H01L 23/3736; H05K 7/20336; H05K 7/20927; H05K 1/181
See application file for complete search history.

(56) References Cited

U.S. PATENT DOCUMENTS 5,103,291 A    4/1992   Lian-Mueller
6,646,289 B1 * 11/2003  Badehi ................ H01L 33/0095
                                                    257/E31.118
(Continued)

FOREIGN PATENT DOCUMENTS

EP    0235503 A2    9/1987

OTHER PUBLICATIONS

Final Office Action for U.S. Appl. No. 17/394,093, mailed Nov. 1, 2023, 19 pages.
Non-Final Office Action for U.S. Appl. No. 17/394,093, mailed Jul. 19, 2023, 18 pages.
Non-Final Office Action for U.S. Appl. No. 17/394,093, mailed Feb. 1, 2024, 19 pages.
(Continued)

*Primary Examiner* — Michael Jung
(74) *Attorney, Agent, or Firm* — Withrow & Terranova, P.L.L.C.

(57) ABSTRACT

The present disclosure relates to a hermetic package capable of handling a high coefficient of thermal expansion (CTE) mismatch configuration. The disclosed hermetic package includes a metal base and multiple segments that are discrete from each other. Herein, a gap exists between every two adjacent ceramic wall segments and is sealed with a connecting material. The ceramic wall segments with the connecting material form a ring wall, where the gap between every two adjacent ceramic wall segments is located at a corner of the ring wall. The metal base is either surrounded by the ring wall or underneath the ring wall.

21 Claims, 4 Drawing Sheets

(51) Int. Cl.
   *H01L 23/10* (2006.01)
   *H01L 23/29* (2006.01)
   *H01L 23/48* (2006.01)
   *H01L 23/00* (2006.01)
   *H01L 23/373* (2006.01)

(52) U.S. Cl.
   CPC ............. *H01L 2224/48225* (2013.01); *H01L 2224/49176* (2013.01); *H01L 2924/01042* (2013.01); *H01L 2924/01074* (2013.01); *H01L 2924/0132* (2013.01); *H01L 2924/01403* (2013.01); *H01L 2924/05432* (2013.01); *H01L 2924/15153* (2013.01); *H01L 2924/1517* (2013.01); *H01L 2924/15747* (2013.01); *H01L 2924/15763* (2013.01); *H01L 2924/15787* (2013.01); *H01L 2924/16747* (2013.01); *H01L 2924/1676* (2013.01); *H01L 2924/173* (2013.01); *H01L 2924/17747* (2013.01); *H01L 2924/1776* (2013.01); *H01L 2924/3512* (2013.01)

(56) References Cited

U.S. PATENT DOCUMENTS

| | | |
|---|---|---|
| 6,962,834 B2 | 11/2005 | Stark |
| 9,859,185 B2* | 1/2018 | Tomie .................... H01L 24/48 |
| 2006/0249835 A1 | 11/2006 | Miyauchi |
| 2013/0308274 A1* | 11/2013 | Murdock ............. H01L 23/373 |
| | | 361/717 |
| 2014/0126135 A1* | 5/2014 | Abbatiello ............. B29C 71/02 |
| | | 264/642 |
| 2014/0306334 A1* | 10/2014 | Takagi .................. H01L 23/047 |
| | | 257/690 |
| 2017/0236742 A1* | 8/2017 | Yota .................... H01L 21/6835 |
| | | 257/774 |
| 2017/0236769 A1 | 8/2017 | Dutta et al. |
| 2021/0134739 A1 | 5/2021 | Tanaka |
| 2021/0217677 A1* | 7/2021 | Lu ............................ H01G 4/33 |
| 2022/0057211 A1* | 2/2022 | Nakashima ........... B81B 7/0074 |
| 2022/0328461 A1* | 10/2022 | Ichikawa ................ H01L 33/44 |

\* cited by examiner

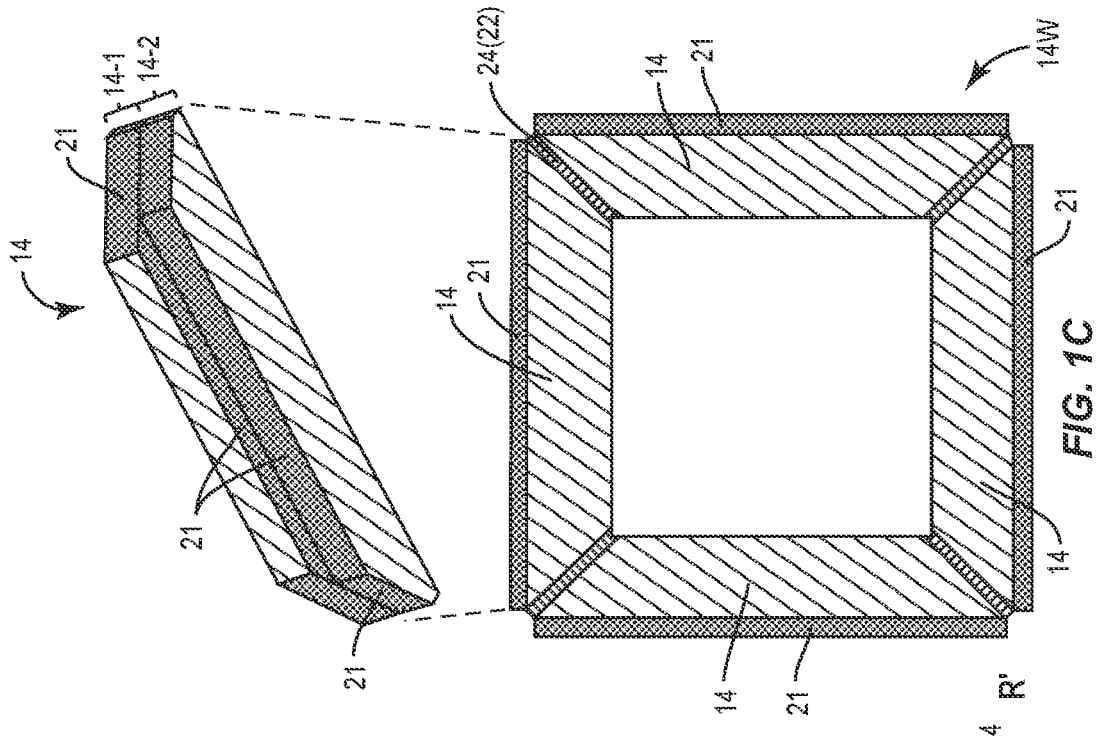
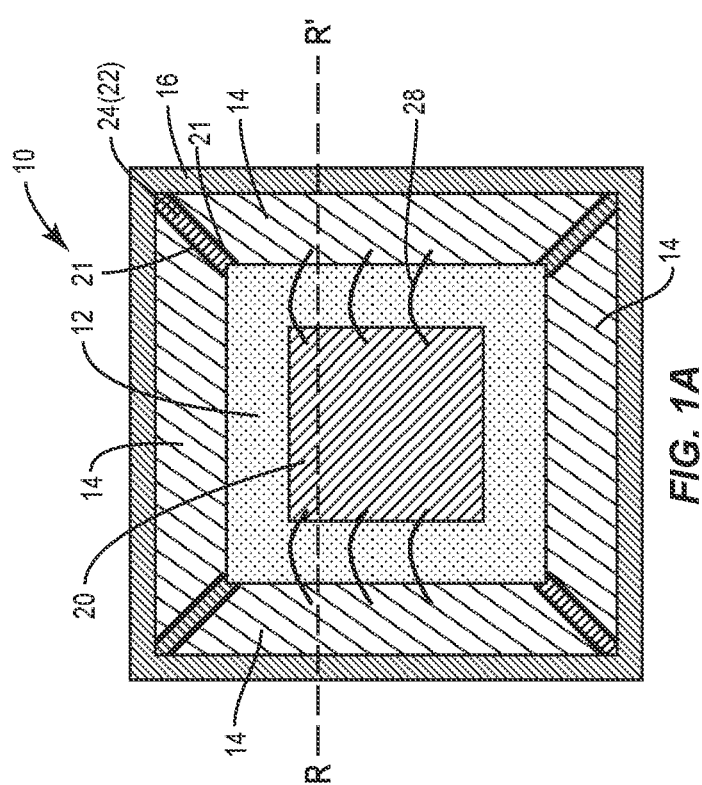
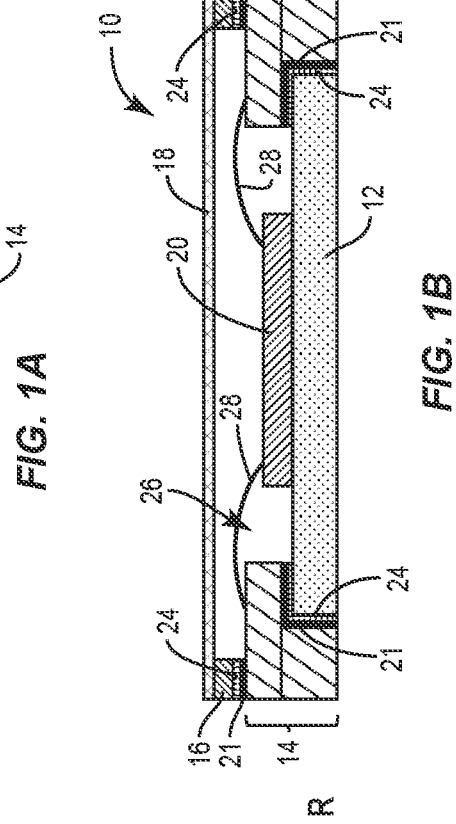
FIG. 1C
FIG. 1A
FIG. 1B

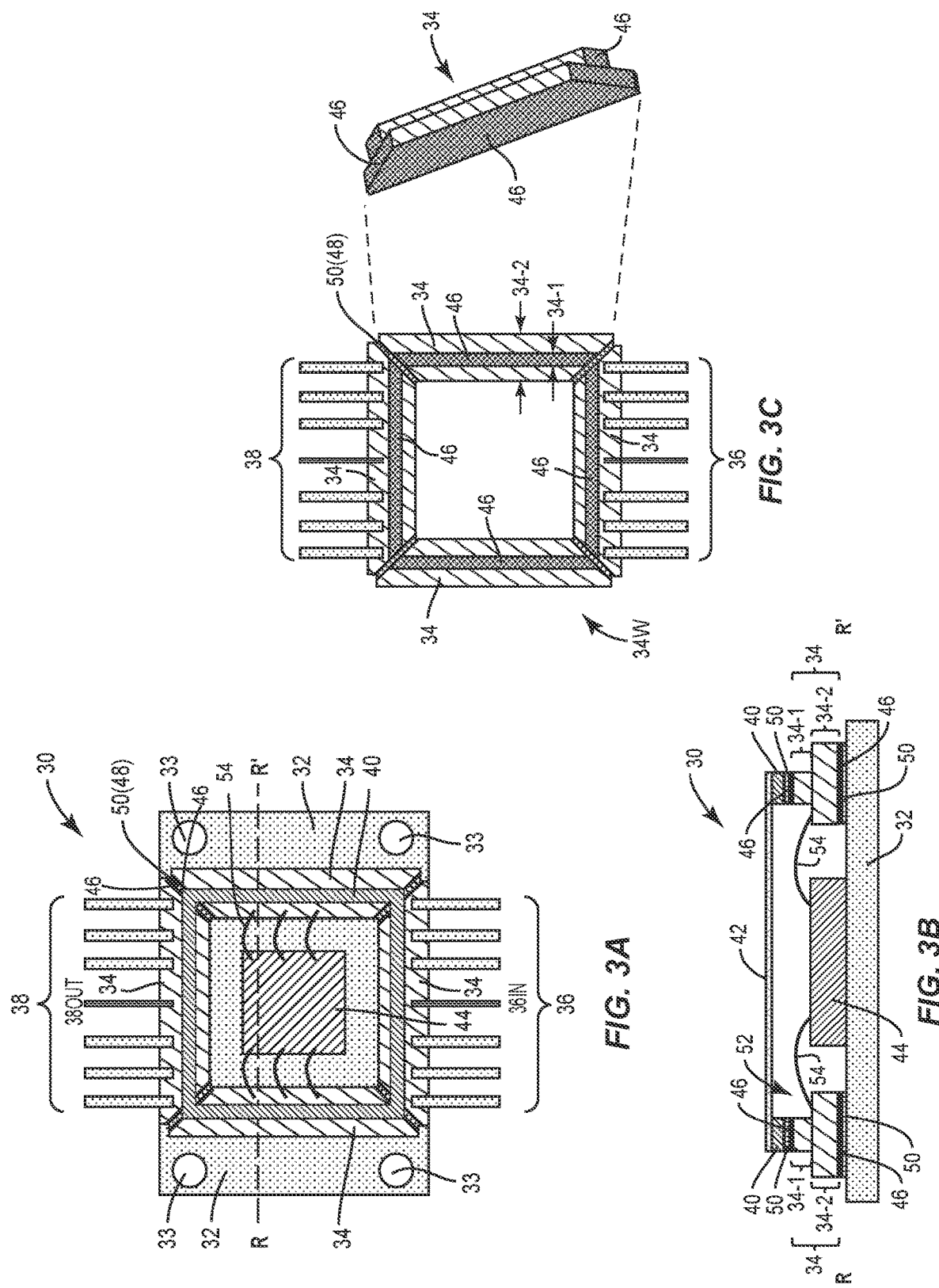

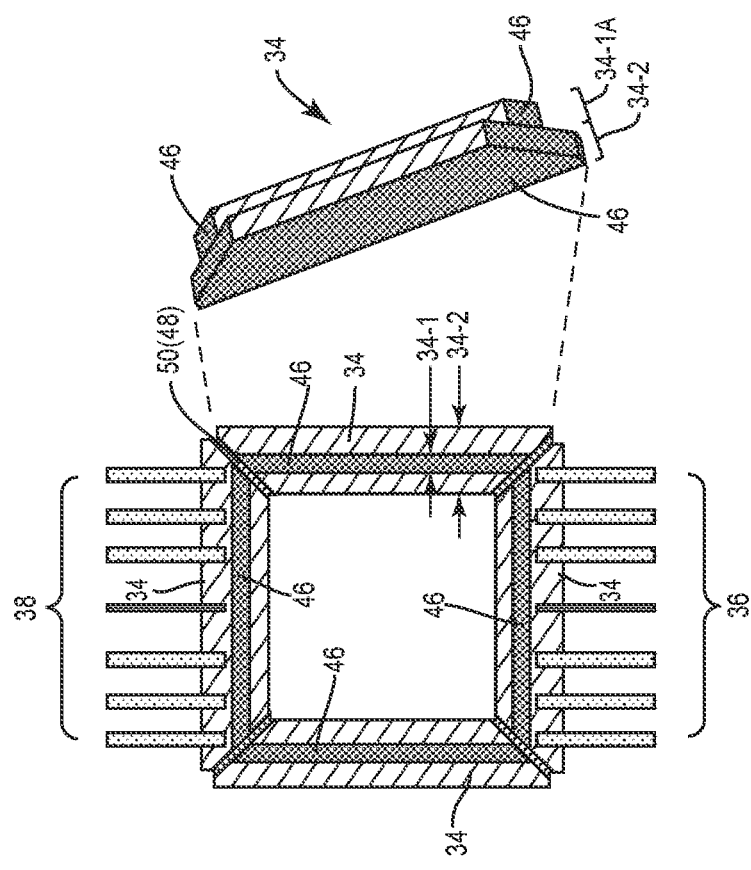
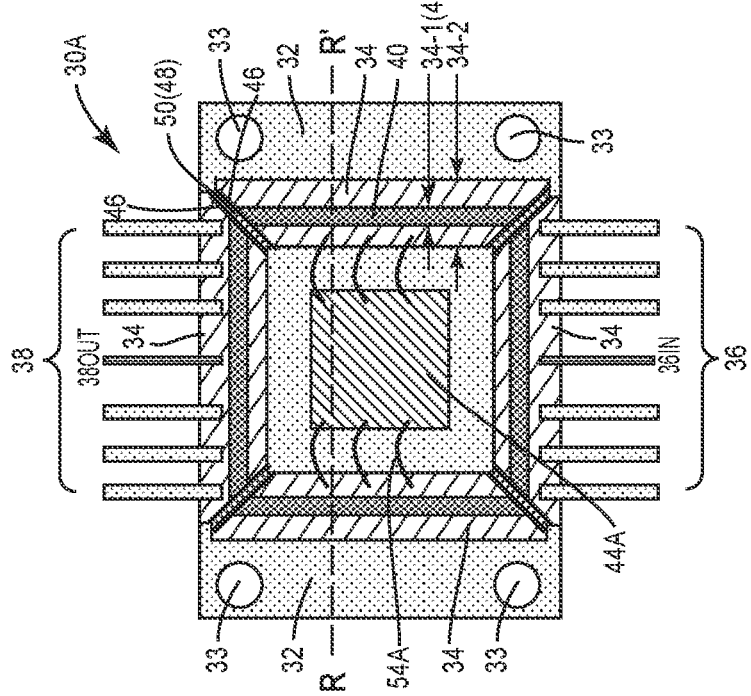
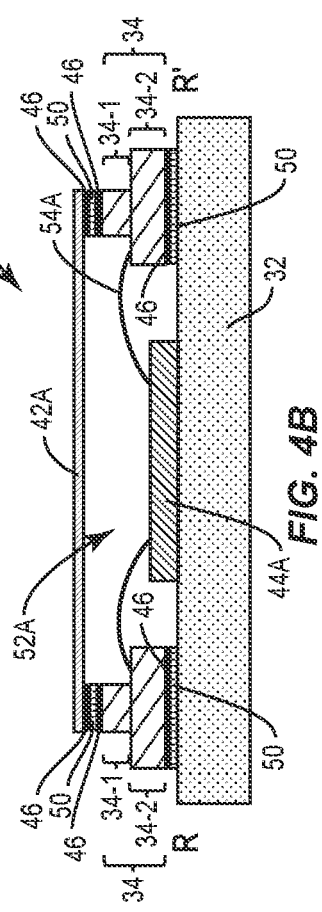
FIG. 4A
FIG. 4B
FIG. 4C

HERMETIC PACKAGE FOR HIGH CTE MISMATCH

RELATED APPLICATIONS

This application claims the benefit of provisional patent application Ser. No. 63/060,766, filed Aug. 4, 2020, the disclosure of which is hereby incorporated herein by reference in its entirety.

This application is related to U.S. patent application Ser. No. 17/394,093, filed on Aug. 4, 2021, and entitled "HERMETIC PACKAGE FOR HIGH CTE MISMATCH," the disclosure of which is hereby incorporated herein by reference in its entirety.

FIELD OF THE DISCLOSURE

The present disclosure relates to a hermetic package, more particularly to a hermetic package capable of handling a high coefficient of thermal expansion (CTE) mismatch configuration for improved thermal performance and service reliability.

BACKGROUND

Semiconductor electronic components (e.g., semiconductor dies, active components, and/or passive components) may be housed in a package, which may be composed of metal, plastic, glass, and/or ceramic. The package may protect the semiconductor electronic components against potentially damaging contact, and may prevent corrosion or other damage, for example, from moisture and/or dust. In particular, electronic products, which are susceptible to harsh environments and conditions and whose disrupted functionality could cause extremely undesired outcomes (e.g., electronic products for petrochemical applications, aerospace applications, medical applications, and etc.) require the use of a hermetic package.

A typical hermetic package may utilize both metal and ceramic materials, where the metal materials may have a much larger coefficient of thermal expansion (CTE) compared to the ceramic materials. To enhance the reliability of the hermetic package (i.e., reduce the possibility of cracking of the ceramic component), it may be necessary to select such metal materials that have relatively low CTE (i.e., reduce CTE mismatch). However, with developed semiconductor fabrication technology, high speed and high-performance transistors may be more densely integrated on semiconductor electronic components. Consequently, the amount of heat generated by the semiconductor electronic components will increase significantly. Accordingly, it is desirable to integrate the semiconductor electronic components with a superior heat dissipation metal base, which will have a high CTE.

To accommodate the increased heat generation of high-performance semiconductor electronic components, it is therefore an object of the present disclosure to provide an improved hermetic package in a configuration for better heat dissipation without ceramic cracking. In addition, there is also a need to manufacture the hermetic package in a cost effective and customizable manner.

SUMMARY

The present disclosure relates to a hermetic package capable of handling a high coefficient of thermal expansion (CTE) mismatch configuration. The disclosed hermetic package includes a metal base with a top surface and multiple segments that are discrete from each other. Herein, a gap exists between every two adjacent ceramic wall segments and is sealed with a connecting material. The ceramic wall segments with the connecting material form a ring wall, where the gap between every two adjacent ceramic wall segments is located at a corner of the ring wall. The metal base is surrounded by the ring wall, and least a portion of the top surface of the metal base is exposed through the ring wall.

In one embodiment of the hermetic package, the gap that exists between every two adjacent ceramic wall segments is between 0-50 thousandth of an inch.

In one embodiment of the hermetic package, the metal base has a CTE>11 µm/m·K, and each ceramic wall segment has a CTE<9 µm/m·K.

In one embodiment of the hermetic package, the metal base is formed of copper, copper molybdenum, copper tungsten, a layered stack of copper and tungsten, or a layered stack of copper and moly. Each ceramic wall segment is formed of alumina.

In one embodiment of the hermetic package, the number of the ceramic wall segments is four, and every two adjacent ceramic wall segments are orthogonal.

In one embodiment of the hermetic package, the four ceramic wall segments are identical, and the ring wall is a square ring wall.

In one embodiment of the hermetic package, each ceramic wall segment has two end sides, and a surface of each end side is metalized. Each gap is formed between the metalized surfaces of the end sides of every two adjacent ceramic wall segments.

In one embodiment of the hermetic package, the surface of each end of each ceramic wall segment is metalized by a metal combination, which includes Titanium Tungsten (TiW), nickel (Ni) over TiW, and gold (Au) over Ni.

In one embodiment of the hermetic package, each ceramic wall segment includes a top region and a bottom region underneath the top region. Herein, the bottom region is smaller than the top region. Inside portions of the top region extend beyond the bottom region, such that each ceramic wall segment has a castellation internal side. Recess surfaces of the castellation internal side are metalized. The metal base is surrounded by the four ceramic wall segments and embedded among the castellation internal side of each ceramic wall segment, such that a portion of the top region of each ceramic wall segment resides over the top surface of the metal base. Each side surface of the metal base and a peripheral portion of the top surface of the metal base are connected to the metalized recess surfaces of the castellation internal side of each ceramic wall segment via the connecting material.

According to one embodiment, the hermetic package further includes a ring structure attached to a peripheral portion of a top surface of the top region of each ceramic wall segment via the connecting material. As such, the top surface of the top region of each ceramic wall segment is partially exposed through the ring structure.

In one embodiment of the hermetic package, the ring structure is formed of a copper alloy or an iron alloy, and the peripheral portion of the top surface of the top region of each ceramic wall segment is metalized.

According to one embodiment, the hermetic package further includes a lid placed over the ring structure. The lid is formed of a copper alloy or an iron alloy, and the ring structure is configured to provide a consistent sealing surface to the lid.

In one embodiment of the hermetic package, the metal base, the ring wall, the ring structure, the lid, and the connecting material form a hermetic cavity, which is capable of accommodating at least one semiconductor die. The at least one semiconductor die is mounted on the at least exposed portion of the top surface of the metal base and located within the hermetic cavity.

In one embodiment of the hermetic package, the top region has a trapezoidal shape in a horizontal plane, and the bottom region has a trapezoidal shape in a horizontal plane. Each ceramic wall segment has an external side with a flat surface, and the surface of each end side of each ceramic wall segment is an inclined surface.

In one embodiment of the hermetic package, each ceramic wall segment includes a top region and a bottom region underneath the top region. Herein, the bottom region is larger than the top region. Inside portions of the bottom region extend beyond the top region, such that each ceramic wall segment has a castellation internal side. An inside surface of the bottom region of each ceramic wall segment is metalized. The metal base is surrounded by the four ceramic wall segments and embedded among the bottom region of each ceramic wall segment. The top region of each ceramic wall segment does not extend over any portion of the top surface of the metal base, and the top surface of the metal base is fully exposed through the four ceramic wall segments. Each side surface of the metal base is connected to the metalized inside surface of the bottom region of a corresponding ceramic wall segment via the connecting material.

According to one embodiment, the hermetic package further includes a lid formed of a ceramic material. The lid is placed over the top region of each ceramic wall segment.

In one embodiment of the hermetic package, each ceramic wall segment is formed of alumina, and a top surface of the top region of each ceramic wall segment is metalized. The lid is formed of alumina, and a peripheral portion of a bottom surface of the lid is metalized. The metalized peripheral portion of the bottom surface of the lid is connected to the metalized top surface of the top region of each ceramic wall segment via the connecting material.

In one embodiment of the hermetic package, the metal base, the ring wall, the lid, and the connecting material form a hermetic cavity, which is capable of accommodating at least one semiconductor die. The at least one semiconductor die is mounted on the exposed top surface of the metal base and located within the hermetic cavity.

In one embodiment of the hermetic package, the connecting material is a solder or a brazing alloy.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A-1C illustrate an exemplary quad-flat no-leads (QFN) hermetic package according to one embodiment of the present disclosure.

FIGS. 3A-3C illustrate an exemplary flanged hermetic package according to one embodiment of the present disclosure.

FIGS. 4A-4C illustrate an alternative flanged hermetic package according to one embodiment of the present disclosure.

Figure 2A:
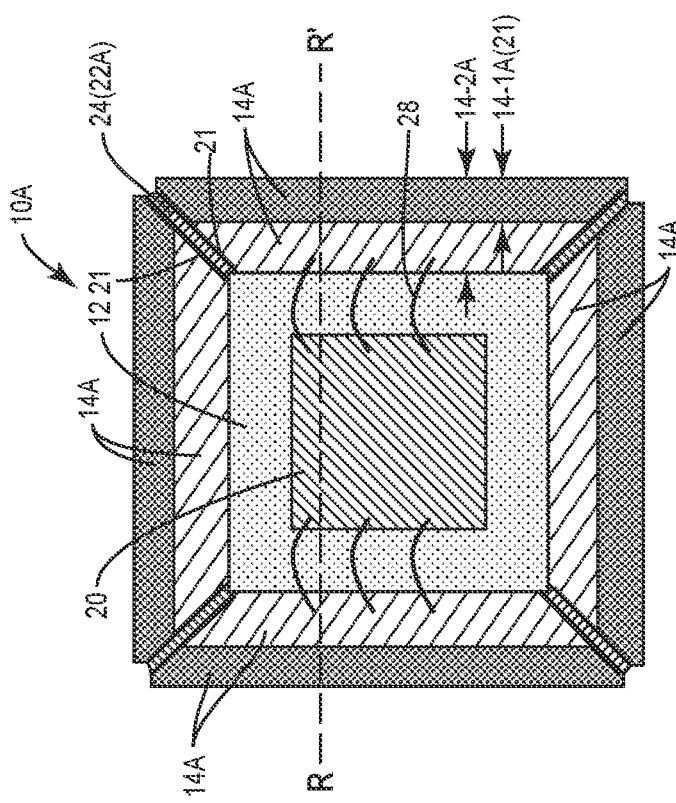
FIGS. 2A-2C illustrate an alternative QFN hermetic package according to one embodiment of the present disclosure.

It will be understood that for clear illustrations, FIGS. 1A-4C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a hermetic package capable of handling a large coefficient of thermal expansion (CTE) mismatch configuration. FIGS. 1A-1C illustrate an exemplary quad-flat no-leads (QFN) hermetic package 10 according to one embodiment of the present disclosure. The QFN hermetic package 10 includes a metal base 12, four ceramic wall segments 14, a ring structure 16, and a lid 18, and is capable of accommodating at least one semiconductor die 20. FIG. 1A shows a top view of the QFN hermetic package 10 without the lid 18, FIG. 1B shows a cross-sectional view of the QFN hermetic package 10 along a dashed line R-R' in FIG. 1A, and FIG. 1C shows details of the ceramic wall segments 14.

In detail, the metal base 12 may be formed of a high CTE (e.g., >11 μm/m·K) metal/alloy material, such as copper, copper molybdenum, copper tungsten, a layered stack of copper and tungsten, or a layered stack of copper and moly. The four ceramic wall segments 14 are discrete from each other and formed of a ceramic material with a relatively low CTE<9 μm/m·K, such as alumina. For the purpose of this illustration, the four ceramic wall segments 14 may be identical, each of which has a trapezoidal (a trapezoidal shape in a horizontal plane) top region 14-1 and a trapezoidal (a trapezoidal shape in a horizontal plane) bottom region 14-2 underneath the trapezoidal top region 14-1. The trapezoidal bottom region 14-2 is smaller than the trapezoidal top region 14-1. Due to the different sizes of the trapezoidal top region 14-1 and the trapezoidal bottom region 14-2, each ceramic wall segment 14 has a castellation internal side (facing the semiconductor die 20), a flat external side (facing the external environment), and two end sides. In this example, recess surfaces of the castellation internal side and inclined surfaces of the two end sides of each ceramic wall segment 14 are metalized by a metal combination 21. In an unlimited example, the metallization is implemented by first sputtering Titanium Tungsten (TiW) over the recess surfaces of the castellation internal side and the inclined surfaces of the two end sides, and then plating nickel (Ni) over TiW, and at last plating gold (Au) over Ni. In one embodiment, the metal combination 21 may be TiW, Ni over TiW, and Au over Ni.

A gap 22 between adjacent ceramic wall segments 14 exists between the metallized inclined surfaces of the end sides of the two adjacent ceramic wall segments 14. Each gap 22 is sealed with a connecting material 24 to provide a compliant and hermetic interface. The connecting material 24 may be a solder or a brazing alloy (e.g., CuSil: a tradename for an alloy of silver and copper). Each gap 22 may be between 0-50 thousandth of an inch, or between 0-10 thousandth of an inch. Herein, the inclined surfaces of the end sides of each ceramic wall segment 14 are metalized for providing solderable/brazing surfaces to the adjacent ceramic wall segments 14.

In one embodiment, the four ceramic wall segments 14 are identical and form a square ring wall 14W with the connecting material 24 (shown in FIG. 1C). The metal base 12 is surrounded by the square ring wall 14W and embedded among the castellation internal side of each ceramic wall segment 14. As such, a portion of the trapezoidal top region 14-1 of each ceramic wall segment 14 resides over a top surface of the metal base 12, and a portion of the top surface of the metal base 12 is exposed through the square ring wall 14W (i.e., through the trapezoidal top region 14-1 of each ceramic wall segment 14) as illustrated in FIG. 1B. Each side surface of the metal base 12 and a peripheral portion of the top surface of the metal base 12 are connected to the recess surfaces of the castellation internal side of each ceramic wall segment 14 via the connecting material 24. Herein, the recess surfaces of the castellation internal side of each ceramic wall segment 14 are metalized for providing solderable/brazing surfaces to connect to the metal base 12.

In different applications, the four ceramic wall segments 14 may be not identical (e.g., the adjacent two ceramic wall segments 14 have different sizes, while the opposite two ceramic wall segments 14 are identical, such that the four ceramic wall segments 14 with the sealed connecting material 24 form a rectangular ring shape). The end sides of each ceramic wall segment 14 may not have inclined surfaces but may have waveform surfaces. Regardless of the size and shape of each ceramic wall segment 14, these four ceramic wall segments 14 must be discrete from each other. In addition, the gap 22 between the adjacent ceramic wall segments 14 is always located at a corner of the ring wall 14W. Typically, the strain caused by CTE mismatch is concentrated at corners of CTE mismatching components. Therefore, a majority of the strain caused by the CTE mismatch between the metal base 12 and the ring wall 14W is concentrated at each gap 22 between the two adjacent ceramic wall segments 14. Since each gap 22 is filled with the flexible connecting material 24, there will be no cracking even with a large CTE mismatch. Accordingly, the QFN hermetic package 10 is capable of handling a large CTE mismatch between the metal base 12 and the ceramic wall segments 14, and thus the metal base 12 can be formed by a high CTE metal/alloy material to improve heat dissipation.

Furthermore, each ceramic wall segment 14 may be a single or multi-layer component. Metal traces (e.g., titanium tungsten traces) may be formed on and/or within each ceramic wall segments 14 (not shown), and vias, typically filled with tungsten, extend partially and/or completely through each ceramic wall segment 14 in a vertical direction (not shown).

The ring structure 16, which may be formed of a copper alloy or an iron alloy (e.g., kovar), resides over a peripheral portion of a top surface of the square ring wall 14W (i.e., over a peripheral portion of a top surface of the trapezoidal top region 14-1 of each ceramic wall segment 14), such that the top surface of each ceramic wall segment 14 (i.e., the top surface of the trapezoidal top region 14-1 of each ceramic wall segment 14) is partially exposed through the ring structure 16. The peripheral portion of the top surface of each ceramic wall segment 14 is also metalized by the metal combination 21 for providing a solderable/brazing surface to connect to the ring structure 16. The ring structure 16 is connected to the metalized peripheral portion of the top surface of each ceramic wall segment 14 via the connecting material 24.

The lid 18, which may be formed of a copper alloy or an iron alloy (e.g., kovar), resides over the ring structure 16. Herein, the ring structure 16 is configured to provide a consistent sealing surface to the lid 18. In some applications, the lid 18 is connected to the ring structure via the connecting material 24 (not shown), and in some applications the lid 18 is connected to the ring structure directly by welding.

The metal base 12, the square ring wall 14W, the ring structure 16, the lid 18, and the connecting material 24 form a hermetic cavity 26. The at least one semiconductor die 20 is mounted on the exposed portion of the top surface of the metal base 12 and located within the hermetic cavity 26. In one embodiment, the at least one semiconductor die 20 is a wire-bonding die. Signals can be transferred between the least one semiconductor die 20 and the ceramic wall segments 14 through wires 28. In addition, the ceramic wall segments 14 can transmit signals to or receive signals from the external environment through the metal traces and the vias (not shown).

Figure 2B:
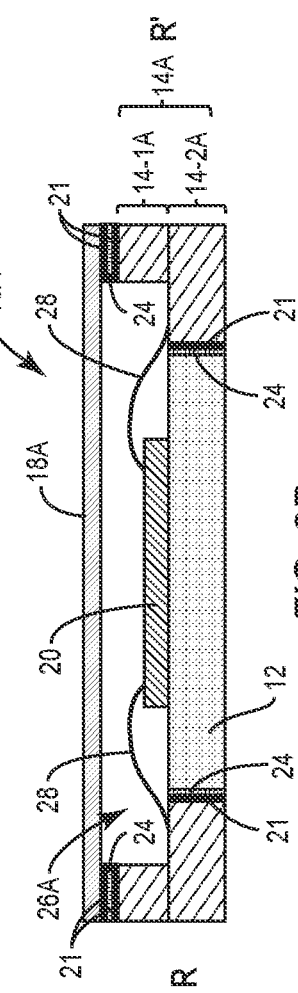
Figure 2C:
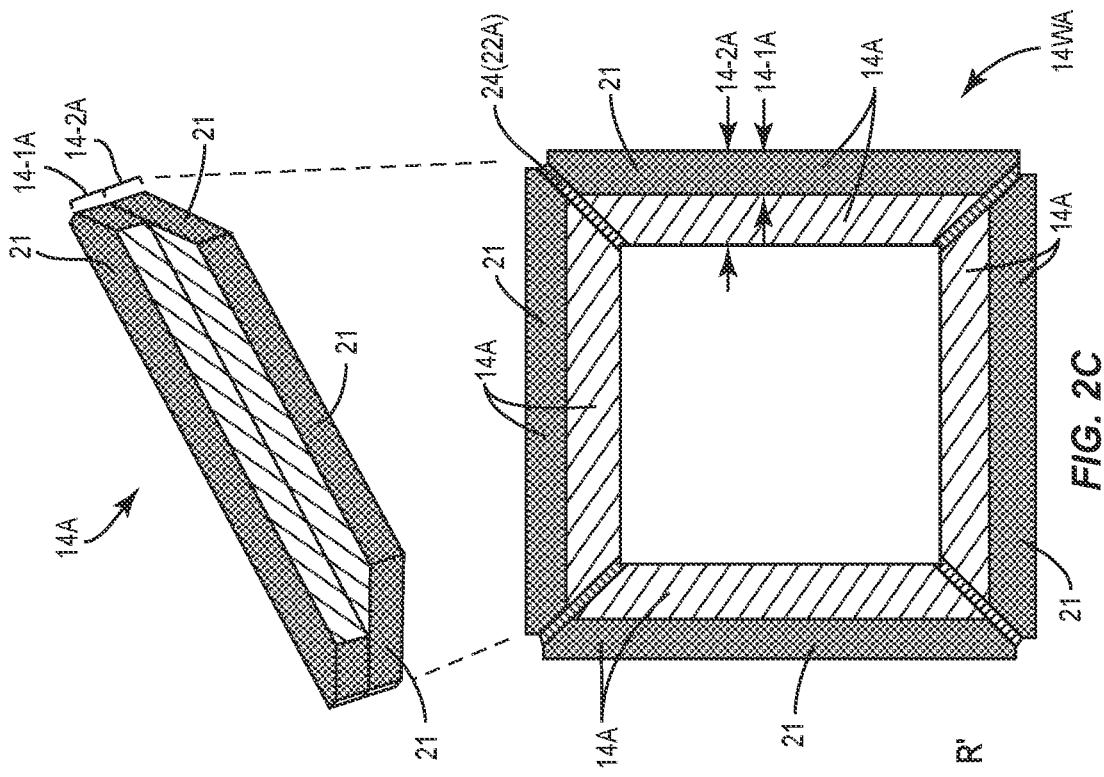

FIGS. 2A-2C illustrate an alternative QFN hermetic package 10A according to one embodiment of the present disclosure. The alternative QFN hermetic package 10A includes the metal base 12, four alternative ceramic wall segments 14A, and an alternative lid 18A, and is capable of accommodating the at least one semiconductor die 20. Unlike the QFN hermetic package 10, the alternative QFN hermetic package 10A does not include a ring structure vertically between the alternative ceramic wall segments 14A and the alternative lid 18A. FIG. 2A shows a top view of the alternative QFN hermetic package 10A without the alternative lid 18A, FIG. 2B shows a cross-sectional view of the alternative QFN hermetic package 10A along a dashed line R-R' in FIG. 2A, and FIG. 2C shows details of the alternative ceramic wall segments 14A.

The alternative four ceramic wall segments 14A are discrete from each other and formed of a ceramic material with a relatively low CTE<9 μm/m·K, such as alumina. For the purpose of this illustration, the four alternative ceramic wall segments 14A may be identical, each of which has an alternative trapezoidal (a trapezoidal shape in a horizontal plane) top region 14-1A and an alternative trapezoidal (a trapezoidal shape in a horizontal plane) bottom region 14-2A larger than the alternative trapezoidal top region 14-1A (details shown in FIG. 2C). Due to the different sizes of the alternative trapezoidal top region 14-1A and the alternative trapezoidal bottom region 14-2A, each alternative ceramic wall segment 14 has a castellation internal side (facing the semiconductor die 20), a flat external side (facing the external environment), and two end sides.

In this example, a top surface of the alternative trapezoidal top region 14-1A, an inside surface (i.e., a surface facing toward the metal base 12) of the alternative trapezoidal bottom region 14-2A, and inclined surfaces of the two end sides are metalized by the metal combination 21. In an unlimited example, the metallization is implemented by first sputtering TiW over the top surface of the alternative trapezoidal top region 14-1A, the inside surface of the alternative trapezoidal bottom region 14-2A, and the inclined surfaces of the two end sides of each alternative ceramic wall segment 14A, and then plating Ni over TiW, and at last plating Au over Ni. In one embodiment, the metal combination 21 may be TiW, Ni over TiW, and Au over Ni.

A gap 22A between adjacent alternative ceramic wall segments 14A exists between the inclined surfaces of the end sides of the alternative adjacent ceramic wall segments 14A and is sealed with the connecting material 24 to provide a compliant and hermetic interface. Each gap 22A may be between 0-50 thousandth of an inch, or between 0-10 thousandth of an inch. The inclined surfaces of the end sides of each alternative ceramic wall segment 14A are metalized for providing solderable/brazing surfaces to the adjacent alternative ceramic wall segments 14A. The four alternative ceramic wall segments 14A with the sealed connecting material 24 form an alternative square ring wall 14WA.

The metal base 12 is surrounded by the alternative square ring wall 14WA and embedded among the alternative trapezoidal bottom region 14-2A of each alternative ceramic wall segment 14A. As such, the alternative trapezoidal top region 14-1A of each alternative ceramic wall segment 14A does not extend over any portion of the top surface of the metal base 12. The top surface of the metal base 12 is not covered by any of the four alternative ceramic wall segments 14A and is fully exposed through the alternative square ring wall 14WA. In addition, each side surface of the metal base 12 is connected to the inside surface of the alternative trapezoidal bottom region 14-2A of a corresponding alternative ceramic wall segment 14A via the connecting material 24. The inside surface of the alternative trapezoidal bottom region 14-2A of each alternative ceramic wall segment 14A is metalized for providing a solderable/brazing surface to connect to the metal base 12.

In different applications, the four alternative ceramic wall segments 14A may be not identical (e.g., the adjacent two alternative ceramic wall segments 14A have different sizes, while the parallel two alternative ceramic wall segments 14A are identical, such that the four alternative ceramic wall segments 14A with the sealed connecting material 24 form a rectangular ring shape). The end sides of each alternative ceramic wall segment 14A may not have inclined surfaces but may have waveform surfaces. Regardless of the size and shape of each alternative ceramic wall segment 14A, these four alternative ceramic wall segments 14A must be discrete from each other. In addition, each gap 22A between every two adjacent alternative ceramic wall segments 14A is always located at a corner of the alternative ring wall 14WA. Typically, the strain caused by CTE mismatch is concentrated at corners of CTE mismatching components. Therefore, a majority of the strain caused by the CTE mismatch between the metal base 12 and the alternative ring wall 14WA is concentrated at each gap 22A. Since each gap 22A is filled with the flexible connecting material 24, there will be no cracking even with a large CTE mismatch. Accordingly, the alternative QFN hermetic package 10A is capable of handling a large CTE mismatch between the metal base 12 and the alternative ceramic wall segments 14, and thus the metal base 12 can be formed by a high CTE metal/alloy material to improve heat dissipation. Similar to the ceramic wall segment 14, each alternative ceramic wall segment 14A may be a single or multi-layer component and includes the metal traces and the vias for signal communication (not shown).

The alternative lid 18A, which may be formed of a ceramic material (e.g., alumina), resides over the alternative trapezoidal top region 14-1A of each alternative ceramic wall segment 14A. Herein, a peripheral portion of a bottom surface of the alternative lid 18A is also metalized by the metal combination 21 (see FIG. 2B). The metalized peripheral portion of the bottom surface of the alternative lid 18A is connected to the metalized top surface of the alternative trapezoidal top region 14-1A of each alternative ceramic wall segment 14A via the connecting material 24.

The metal base 12, the alternative ceramic wall segments 14A, the alternative lid 18A, and the connecting material 24 form an alternative hermetic cavity 26A. The at least one semiconductor die 20 is mounted on the exposed top surface of the metal base 12 and located within the alternative hermetic cavity 26A. In one embodiment, the at least one semiconductor die 20 is a wire-bonding die. Signals can be transferred between the least one semiconductor die 20 and the alternative ceramic wall segments 14A through the wires 28.

FIGS. 3A-3C illustrate an exemplary flanged hermetic package 30 according to one embodiment of the present disclosure. The flanged hermetic package 30 includes a metal base 32 with a number of holes 33, four ceramic wall segments 34, a number of input-side leads 36, a number of output-side leads 38, a ring structure 40, and a lid 42, and is capable of accommodating at least one semiconductor die 44. FIG. 3A shows a top view of the flanged hermetic package 30 without the lid 42, FIG. 3B shows a cross-sectional view of the flanged hermetic package 30 along a dashed line R-R' in FIG. 3A, and FIG. 3C shows details of the ceramic wall segments 34.

In detail, the metal base 32 may be formed of a high CTE (e.g., >11 μm/m·K) metal/alloy material, such as copper, copper molybdenum, copper tungsten, a layered stack of copper and tungsten, or a layered stack of copper and moly. The holes 33 in the metal base 32 are suitable for receiving a fastening means, such as screws or pins. The holes 33 may allow the flanged hermetic package 30 to be affixed to a host device or system, such as an RF system.

The four ceramic wall segments 34 are discrete from each other and formed of a ceramic material with a relatively low CTE<9 μm/m·K, such as alumina. For the purpose of this illustration, the four ceramic wall segments 34 may be identical, each of which has a trapezoidal (a trapezoidal shape in a horizontal plane) top region 34-1 and a trapezoidal (a trapezoidal shape in a horizontal plane) bottom region 34-2 larger than the trapezoidal top region 34-1 (details shown in FIG. 3C). In one embodiment, the trapezoidal top region 34-1 is located above a middle portion of a top surface of the trapezoidal bottom region 34-2, such that an inner portion and an outer portion of the top surface of the trapezoidal bottom region 34-2 are exposed.

Due to the different sizes of the trapezoidal top region 34-1 and the trapezoidal bottom region 34-2, each ceramic wall segment 34 may have a castellation internal side (facing the semiconductor die 44), a castellation external side (facing the external environment), and two end sides. In this example, a top surface of the trapezoidal top region 34-1, a bottom surface of the trapezoidal bottom region 34-2, and inclined surfaces of the two end sides of each ceramic wall segment 34 are metalized by a metal combination 46. In an unlimited example, the metallization is implemented by first sputtering TiW over the inclined surfaces of the two end sides of each ceramic wall segment 34, and then plating Ni over TiW, and at last plating Au over Ni. In one embodiment, the metal combination 46 may be TiW, Ni over TiW, and Au over Ni.

A gap 48 between adjacent ceramic wall segments 34 exists between the inclined surfaces of the end sides of the adjacent ceramic wall segments 34 and is sealed with a connecting material 50 to provide a compliant and hermetic interface. The connecting material 50 may be a solder or a brazing alloy (e.g., CuSil: a tradename for an alloy of silver and copper). Each gap 48 may be between 0-50 thousandth of an inch, or between 0-10 thousandth of an inch. The inclined surfaces of the end sides of each ceramic wall segment 34 are metalized for providing solderable/brazing surfaces to the adjacent ceramic wall segments 34. The four ceramic wall segments 34 with the sealed connecting material 50 form a square ring wall 34W.

The metalized bottom surface of each ceramic wall segment 34 is attached to a top surface of the metal base 32 via the connecting material 50. A portion of the top surface of the metal base 32 is exposed through the square ring wall 34W (i.e., through the trapezoidal bottom region 34-2 of each ceramic wall segment 34). The bottom surface of each ceramic wall segment 34 (i.e., a bottom surface of the trapezoidal bottom region 14-2 of each ceramic wall segment 34) is metalized by the metal combination 46 for providing a solderable/brazing surface to connect to the metal base 32.

In different applications, the four ceramic wall segments 34 may not be identical (e.g., the adjacent two ceramic wall segments 34 have different sizes, while the parallel two ceramic wall segments 34 are identical, such that the four ceramic wall segments 34 with the sealed connecting material 50 form a rectangular ring shape). The end sides of each ceramic wall segment 34 may not have inclined surfaces but may have waveform surfaces. Regardless of the size and shape of each ceramic wall segment 34, these four ceramic wall segments 34 must be discrete from each other. In addition, each gap 48 between every two adjacent ceramic wall segments 34 is always located at a corner of the ring wall 34W. Typically, the strain caused by CTE mismatch is concentrated at corners of CTE mismatching components. Therefore, a majority of the strain caused by the CTE mismatch between the metal base 32 and the square ring wall 34W is concentrated at each gap 48 between the adjacent ceramic wall segments 34. Since each gap 48 is filled with the flexible connecting material 50, there will be no cracking even with a large CTE mismatch. Accordingly, the flanged hermetic package 30 is capable of handling a large CTE mismatch between the metal base 32 and the ceramic wall segments 34, and thus the metal base 32 can be formed by a high CTE metal/alloy material to improve heat dissipation.

Furthermore, each ceramic wall segment 34 may be a single or multi-layer component. Metal traces (e.g., titanium tungsten traces) may be formed on and/or within each ceramic wall segment 34 (not shown), and vias, typically filled with tungsten, extend partially and/or completely through each ceramic wall segment 34 in a vertical direction (not shown).

The input-side leads 36 are leads located at a first (input) side of the flanged hermetic package 30, on which the flanged hermetic package 30 will receive input signals. The input-side leads 36 at least include an input signal lead 36IN configured to receive input signals for the at least one semiconductor die 44. In addition, the input-side leads 36 may also include direct current (DC) leads configured to receive a DC power source and/or ground leads configured to be connected to ground (not specified). Each input-side lead 36 might be formed of a metal or metal alloy, such as copper. Each input-side lead 36 is electrically connected to one of the ceramic wall segments 34 (i.e., soldering/brazing to the metal traces of one ceramic wall segment 34). In one embodiment, each input-side lead 36 may reside over the exposed outer portion of the top surface of the trapezoidal bottom region 34-2 and extends outward from a corresponding ceramic wall segment 34.

The output-side leads 38 are leads located at a second (output) side of the flanged hermetic package 30, on which the flanged hermetic package 30 will provide output signals to an external circuitry/system. The output-side leads 38 at least include one output signal lead 38OUT, which is configured to transmit output signals generated by the at least one semiconductor die 44. In addition, the output-side leads 38 may also include DC leads and/or ground leads (not specified). Each output-side lead 38 might be formed of a metal or metal alloy, such as copper. Each output-side lead 38 is electrically connected to one of the ceramic wall segments 34 (i.e., soldering/brazing to the metal traces of one ceramic wall segment 34).

In one embodiment, the first (input) side of the flanged hermetic package 30 is opposite to the second (output) side of the flanged hermetic package 30. Herein, each output-side lead 38 may reside over the exposed outer portion of the top surface of the trapezoidal bottom region 34-2 and extends outward from a corresponding ceramic wall segment 34, which is parallel to the one ceramic wall segment 34 corresponding to the input-side leads 36. In different applications, the first (input) side of the flanged hermetic package 30 and the second (output) side of the flanged hermetic package 30 may be orthogonal.

The ring structure 40, which may be formed of a copper alloy or an iron alloy (e.g., kovar), is attached to the metalized top surface of each ceramic wall segment 34, more specifically to the metalized top surface of the trapezoidal top region 34-1 of each ceramic wall segment 34 via the connecting material 50. The top surface of the trapezoidal top region 34-1 of each ceramic wall segment 34 is metalized by the metal combination 46 for providing a solderable/brazing surface to connect to the ring structure 40.

The lid 42, which may be formed of a copper alloy or an iron alloy (e.g., kovar), resides over the ring structure 40. Herein, the ring structure 40 is configured to provide a consistent sealing surface to the lid 42. In some applications, the lid 42 is connected to the ring structure via the connecting material 50 (not shown), and in some applications the lid 42 is connected to the ring structure directly by welding.

The metal base 32, the ceramic wall segments 34, the ring structure 40, the lid 42, and the connecting material 50 form a hermetic cavity 52. The at least one semiconductor die 44 is mounted on the exposed portion of the top surface of the metal base 32 and located within the hermetic cavity 52. In one embodiment, the at least one semiconductor die 44 is a wire-bonding die. The input and output signals can be transferred between the least one semiconductor die 44 and the ceramic wall segments 34 through wires 54.

FIGS. 4A-4C illustrate an alternative flanged hermetic package 30A according to one embodiment of the present disclosure. The alternative flanged hermetic package 30A includes the metal base 32 with the holes 33, the four ceramic wall segments 34, the input-side leads 36, the number of output-side leads 38, and an alternative lid 42A, and is capable of accommodating at least one low-profile semiconductor die 44A. FIG. 4A shows a top view of the alternative flanged hermetic package 30A without the alternative lid 42A, FIG. 4B shows a cross-sectional view of the alternative flanged hermetic package 30A along a dashed line R-R' in FIG. 4A, and FIG. 4C shows details of the ceramic wall segments 34.

Due to a relatively thin thickness of the low-profile semiconductor die 44A, the alternative flanged hermetic package 30A may not need a ring structure to achieve a relatively large height cavity. For each ceramic wall segments 34, the top surface of the trapezoidal top region 34-1, the bottom surface of the trapezoidal bottom region 34-2, and the inclined surfaces of the two end sides of each ceramic wall segment 34 are still metalized. The four ceramic wall segments 34 are discrete from each other with the gap 48, which is sealed with the connecting material 50. The four ceramic wall segments 34 with the connecting material 50 filled in each gap 48 form the square ring wall 34W.

The alternative lid 42A, which may be formed of a ceramic material (e.g., alumina), resides over the top surface of the square ring wall 34W. Herein, a peripheral portion of a bottom surface of the alternative lid 42A is also metalized by the metal combination 46 (see FIG. 4B). The metalized peripheral portion of the bottom surface of the alternative lid 42A is connected to the metalized top surface of the trapezoidal top region 34-1 of each ceramic wall segment 34 via the connecting material 50.

The metal base 32, the square ring wall 34W, the alternative lid 42A, and the connecting material 50 form an alternative hermetic cavity 52A with a relatively low height. The at least one low-profile semiconductor die 44A is mounted on the exposed portion of the top surface of the metal base 32 and located within the alternative hermetic cavity 52A. In one embodiment, the at least one low-profile semiconductor die 44A is a wire-bonding die. The input and output signals can be transferred between the least one low-profile semiconductor die 44A and the ceramic wall segments 34 through wires 54A.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A package comprising:
   a metal base having a top surface; and
   multiple ceramic wall segments discrete from each other and having no overlap in a horizontal plane, wherein:
   a gap exists between every two adjacent ceramic wall segments and is sealed with a connecting material, wherein the ceramic wall segments and the connecting material are formed of different materials;

each of the ceramic wall segments and the connecting material form a ring wall, wherein the gap between every two adjacent ceramic wall segments is located at a corner of the ring wall;

the metal base has a coefficient of thermal expansion (CTE)>11 µm/m·K, and each ceramic wall segment has a CTE<9 µm/m·K; and the metal base is surrounded by the ring wall, wherein each side surface of the metal base is fully covered by the ring wall, and at least a portion of the top surface of the metal base is exposed through the ring wall.

2. The package of claim 1 wherein the gap that exists between every two adjacent ceramic wall segments is less than 50 thousandth of an inch.

3. The package of claim 1 wherein:
the metal base is formed of copper, copper molybdenum, or copper tungsten; and
each ceramic wall segment is formed of alumina.

4. The package of claim 1 wherein the number of the ceramic wall segments is four, and every two adjacent ceramic wall segments are orthogonal.

5. The package of claim 4 wherein the four ceramic wall segments are identical, and the ring wall is a square ring wall.

6. The package of claim 4 wherein:
each ceramic wall segment has two end sides, and a surface of each end side is metalized; and
each gap is formed between the metalized surfaces of the end sides of every two adjacent ceramic wall segments.

7. The package of claim 6 wherein:
each ceramic wall segment includes a top region and a bottom region underneath the top region;
the bottom region is smaller than the top region, wherein inside portions of the top region extend beyond the bottom region, such that each ceramic wall segment has a castellation internal side;
recess surfaces of the castellation internal side are metalized; and
the metal base is surrounded by the four ceramic wall segments and embedded among the castellation internal side of each ceramic wall segment, such that a portion of the top region of each ceramic wall segment resides over the top surface of the metal base, wherein each side surface of the metal base and a peripheral portion of the top surface of the metal base are connected to the metalized recess surfaces of the castellation internal side of each ceramic wall segment via the connecting material.

8. The package of claim 7 further comprising a ring structure attached to a peripheral portion of a top surface of the top region of each ceramic wall segment via the connecting material, such that the top surface of the top region of each ceramic wall segment is partially exposed through the ring structure.

9. The package of claim 8 wherein:
the ring structure is formed of a copper alloy or an iron alloy; and
the peripheral portion of the top surface of the top region of each ceramic wall segment is metalized.

10. The package of claim 9 further comprising a lid placed over the ring structure, wherein the lid is formed of a copper alloy or an iron alloy, and the ring structure is configured to provide a consistent sealing surface to the lid.

11. The package of claim 10 wherein the metal base, the ring wall, the ring structure, the lid, and the connecting material form a hermetic cavity, which is capable of accommodating at least one semiconductor die, wherein the at least one semiconductor die is mounted on the at least exposed portion of the top surface of the metal base and located within the hermetic cavity.

12. The package of claim 7 wherein:
the top region has a trapezoidal shape in a horizontal plane, and the bottom region has a trapezoidal shape in a horizontal plane; and
each ceramic wall segment has an external side with a flat surface, and the surface of each end side of each ceramic wall segment is an inclined surface.

13. The package of claim 6 wherein:
each ceramic wall segment includes a top region and a bottom region underneath the top region;
the bottom region is larger than the top region, wherein inside portions of the bottom region extend beyond the top region, such that each ceramic wall segment has a castellation internal side;
an inside surface of the bottom region of each ceramic wall segment is metalized; and
the metal base is surrounded by the four ceramic wall segments and embedded among the bottom region of each ceramic wall segment, wherein:
the top region of each ceramic wall segment does not extend over any portion of the top surface of the metal base, and the top surface of the metal base is fully exposed through the four ceramic wall segments; and
each side surface of the metal base is connected to the metalized inside surface of the bottom region of a corresponding ceramic wall segment via the connecting material.

14. The package of claim 13 further comprising a lid formed of a ceramic material, wherein the lid is placed over the top region of each ceramic wall segment.

15. The package of claim 14 wherein:
each ceramic wall segment is formed of alumina, wherein a top surface of the top region of each ceramic wall segment is metalized;
the lid is formed of alumina, wherein a peripheral portion of a bottom surface of the lid is metalized; and
the metalized peripheral portion of the bottom surface of the lid is connected to the metalized top surface of the top region of each ceramic wall segment via the connecting material.

16. The package of claim 14 wherein the metal base, the ring wall, the lid, and the connecting material form a hermetic cavity, which is capable of accommodating at least one semiconductor die, wherein the at least one semiconductor die is mounted on the exposed top surface of the metal base and located within the hermetic cavity.

17. The package of claim 13 wherein:
the top region has a trapezoidal shape in a horizontal plane, and the bottom region has a trapezoidal shape in a horizontal plane; and
each ceramic wall segment has an external side with a flat surface, and the surface of each end side of each ceramic wall segment is an inclined surface.

18. The package of claim 6 wherein the surface of each end of each ceramic wall segment is metalized by a metal combination, which includes Titanium Tungsten (TiW), nickel (Ni) over TiW, and gold (Au) over Ni.

19. The package of claim 1 wherein the connecting material is a solder or a brazing alloy.

20. The package of claim 1 wherein:
the metal base is formed of a layered stack of copper and tungsten or a layered stack of copper and moly; and
each ceramic wall segment is formed of alumina.

21. The package of claim 1 wherein each side surface of the metal base is connected to the ring wall through a metal combination, which includes TiW, Ni over TiW, and Au over Ni.

\* \* \* \* \*